(12) United States Patent
Merton et al.

(10) Patent No.: US 12,044,750 B2
(45) Date of Patent: Jul. 23, 2024

(54) ESTIMATION OF REMAINING LIFE OF SYSTEM COMPONENTS

(71) Applicant: Advanced Energy Industries, Inc., Fort Collins, CO (US)

(72) Inventors: Andrew Merton, Fort Collins, CO (US); John Powell, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 67 days.

(21) Appl. No.: 17/701,212

(22) Filed: Mar. 22, 2022

(65) Prior Publication Data

US 2022/0334197 A1    Oct. 20, 2022

Related U.S. Application Data

(60) Provisional application No. 63/171,390, filed on Apr. 6, 2021, provisional application No. 63/166,263, filed on Mar. 26, 2021.

(51) Int. Cl.
*G01R 31/64* (2020.01)
*H01J 37/32* (2006.01)
*H03H 7/38* (2006.01)

(52) U.S. Cl.
CPC ........ *G01R 31/64* (2020.01); *H01J 37/32183* (2013.01); *H03H 7/38* (2013.01)

(58) Field of Classification Search
CPC ....... G01R 31/64; H03H 7/38; G05B 23/0283
See application file for complete search history.

(56) References Cited

U.S. PATENT DOCUMENTS

| | | | |
|---|---|---|---|
| 8,437,904 B2 | 5/2013 | Mansouri et al. | |
| 8,478,479 B2 | 7/2013 | Ghelam | |
| 10,295,636 B2* | 5/2019 | Song | G01R 33/3607 |
| 2007/0088570 A1 | 4/2007 | Shetty et al. | |
| 2008/0288028 A1* | 11/2008 | Larson | H01Q 1/273 |
| | | | 607/60 |

(Continued)

OTHER PUBLICATIONS

Matos, Taina, "International Search Report and Written Opinion Re International Application No. PCT/US2022/021344", Jun. 21, 2022, p. 9, Published in: PCT.

(Continued)

*Primary Examiner* — Jermele M Hollington
*Assistant Examiner* — Temilade S Rhodes-Vivour
(74) *Attorney, Agent, or Firm* — Neugeboren O'Dowd PC

(57) ABSTRACT

An electrical system comprising a match network comprising a plurality of capacitors, a controller, and a life-consumed module. The controller is configured to operate the plurality of capacitors and relay telemetry data for at least one of the plurality of capacitors to the life-consumed module. The life-consumed module is configured to receive the telemetry data from the controller, environmental data from an environmental input, and reliability data comprising a reliability curve for at least one of the plurality of capacitors from a reliability data datastore, compare the telemetry data and the environmental data to the reliability curve of at least one of the plurality of capacitors, determine the cumulative life consumed of at least one of the plurality of capacitors, and report an estimate of indicative life consumed for at least one of the plurality of capacitors.

20 Claims, 9 Drawing Sheets

(56) References Cited

U.S. PATENT DOCUMENTS

| | | | |
|---|---|---|---|
| 2009/0249128 A1 | 10/2009 | Heckman et al. | |
| 2014/0071015 A1* | 3/2014 | Zheng | A61N 1/37252 |
| | | | 343/860 |
| 2015/0200079 A1* | 7/2015 | Bhutta | H03H 7/40 |
| | | | 438/10 |
| 2015/0365013 A1* | 12/2015 | Hameed | H02M 7/25 |
| | | | 363/126 |
| 2016/0126920 A1 | 5/2016 | Kaper | |
| 2016/0266189 A1 | 9/2016 | Yoshida | |
| 2017/0317647 A1* | 11/2017 | Smeltzer | H03F 3/2171 |
| 2020/0234926 A1 | 7/2020 | Lozic et al. | |

OTHER PUBLICATIONS

Simin Baharlou, Patent Cooperation Treaty, International Preliminary Report of Patentability, Oct. 5, 2023, The International Bureau of WIPO, Switzerland.

* cited by examiner

ESTIMATION OF REMAINING LIFE OF SYSTEM COMPONENTS

CLAIM OF PRIORITY UNDER 35 U.S.C. § 119

The present Application for Patent claims priority to Provisional Application No. 63/166,263 entitled "ESTIMATION OF REMAINING LIFE OF SYSTEM COMPONENTS" filed Mar. 26, 2021, and Provisional Application No. 63/171,390 entitled "ESTIMATION OF REMAINING LIFE OF SYSTEM COMPONENTS" filed Apr. 6, 2021. Both of these provisional applications are assigned to the assignee hereof and hereby expressly incorporated by reference herein.

BACKGROUND

Field

The present disclosure relates generally to reliability analysis. In particular, but not by way of limitation, the present disclosure relates to improved systems, methods and apparatuses for estimating the life consumed of system components.

Background

In many types of systems, quantifying a risk of failure of system components is a routine process. But the typical processes for quantifying risks of failure assume a standard or average usage pattern to forecast life expectancy—regardless of actual usage patterns and environmental conditions. As a consequence, the typical approaches to quantifying failure risks potentially grossly underestimate or overestimate the remaining life of system components and/or the system as a whole.

In plasma processing applications, such as the manufacture of semiconductors or flat panel displays, radio frequency (RF) power generators apply a voltage to a load in a plasma chamber and may operate over a wide range of frequencies. The impedance of a plasma can vary with the frequency of this applied voltage, the chamber pressure, chamber temperature, gas composition, target, and substrate material. Consequently, a reactive impedance matching network is typically used to transform the chamber impedance to an ideal load for the power generator (e.g., an RF power generator).

Matching networks include tunable elements, such as adjustable vacuum capacitors, to provide efficient transfer of power from the generator to the plasma in the chamber by matching the impedance of the plasma to the operating impedance of the generator, for example, 50 ohms.

The vacuum capacitors typically used in matching networks contain a capacitor in vacuum with a movable electrode. This requires electrical coupling to a moving part inside the vacuum from a terminal outside the vacuum. This is traditionally implemented with a complicated mechanical structure, including elastic bellows, to preserve a required vacuum seal while permitting the capacitor to be variable in its capacitance. In some variable capacitors, rotational motion of the terminal outside the vacuum chamber is translated into lateral motion inside the vacuum chamber to vary the extent to which two capacitor plates are intermeshed, thereby allowing for adjustable capacitance of the capacitor. Such capacitors are prone to failure because of the complex mechanical structure employed. There is therefore a need in the art for an improved approach to estimating the life consumed of system components such as variable vacuum capacitors and other system components.

SUMMARY

Aspects disclosed herein address the above stated needs by disclosing improved systems, methods and apparatuses for estimating the life consumed of system components within a match network. The electrical system comprising a match network comprising a plurality of capacitors; a controller; a life-consumed module; the plurality of capacitors comprising at least one shunt capacitor and at least one series capacitor; the at least one shunt capacitor disposed across at least one transmission line; the at least one series capacitor disposed in series along the at least one transmission line; the at least one shunt capacitor and the at least one series capacitor coupled to the controller by control lines; the controller configured to: operate the plurality of capacitors, and relay telemetry data for at least one of the plurality of capacitors to the life-consumed module; and wherein the life-consumed module is configured to: receive the telemetry data from the controller, environmental data from an environmental input, and reliability data comprising a reliability curve for at least one of the plurality of capacitors from a reliability data datastore, compare the telemetry data and the environmental data to the reliability curve of at least one of the plurality of capacitors, determine the cumulative life consumed of at least one of the plurality of capacitors, and report an estimate of indicative life consumed for at least one of the plurality of capacitors.

BRIEF DESCRIPTION OF THE DRAWINGS

The objects, features, and attendant advantages of the present disclosure are fully appreciated as the same becomes better understood when considered in conjunction with the accompanying drawings.

DETAILED DESCRIPTION

Figure 1:
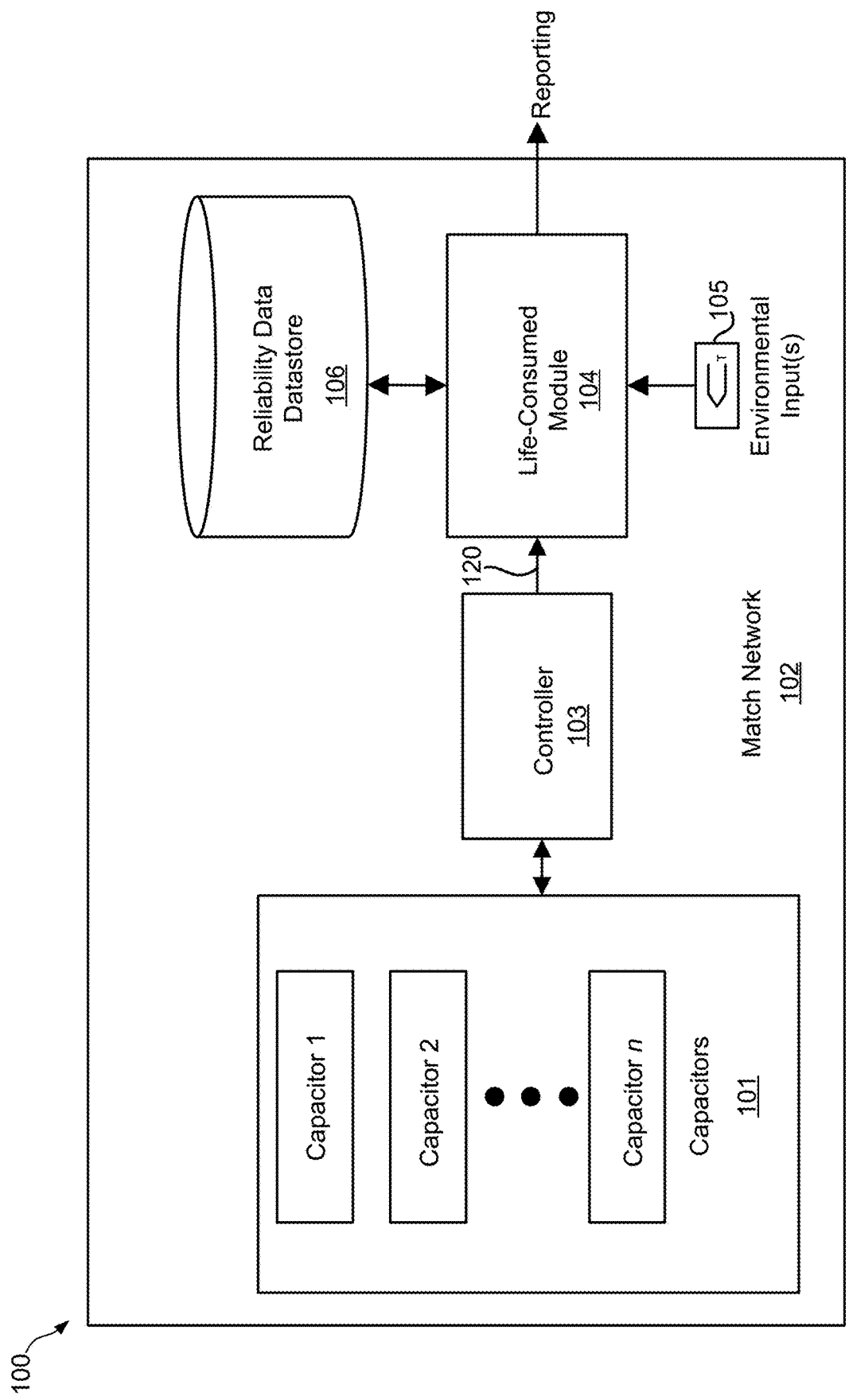
FIG. 1 is a block diagram depicting physical components within a match network that may be utilized to realize the data estimates of life consumed for the capacitors in the match network of an embodiment of the present invention.

The present disclosure relates generally to reliability analysis. In particular, but not by way of limitation, the present disclosure relates to improved systems, methods and apparatuses for estimating the life consumed of system components within a match network.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Additionally, the flowcharts and block diagrams in the following Figures illustrate the functionality and operation of possible implementations according to various embodiments of the present disclosure. It should be noted that, in some alternative implementations, the functions noted in each block may occur out of the order noted in the Figures. For example, two blocks shown in succession may, in fact, be executed substantially concurrently, or the blocks may sometimes be executed in the reverse order, depending upon the functionality involved.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items and may be abbreviated as "/".

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

Figure 2:
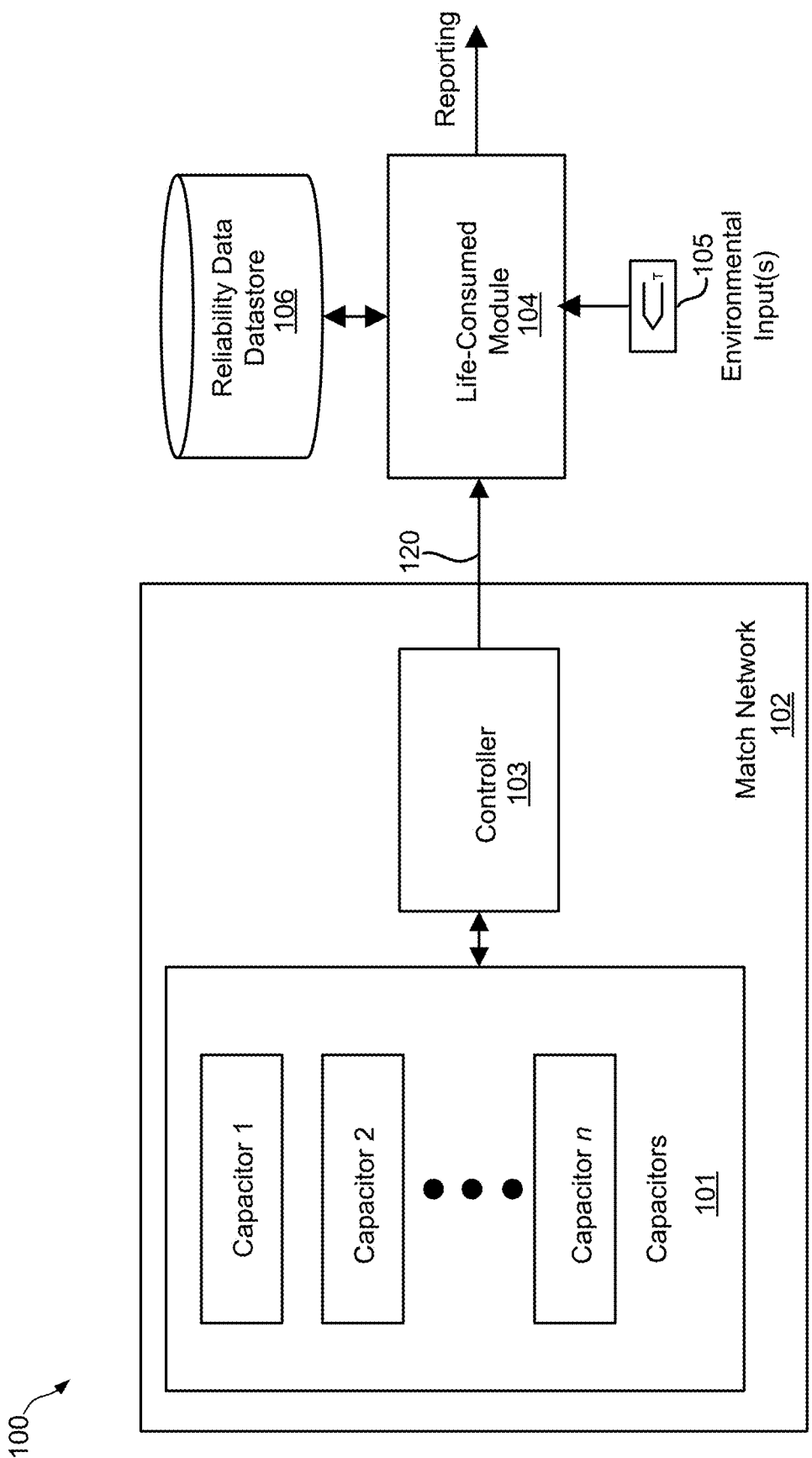
FIG. 2 is a block diagram depicting physical components both within and separate from a match network that may be utilized to realize the data estimates of life consumed for the capacitors in the match network of an embodiment of the present invention.

Referring first to FIGS. 1 and 2 shown are electrical systems 100 where aspects of the present disclosure may be implemented. As shown, each of the electrical systems 100 include a plurality of capacitors 101, a controller 103 configured to operate at least one of the plurality of capacitors 101, and a life-consumed module 104 configured to update (e.g., substantially continuously) estimates of life consumed for at least one of the plurality of capacitors 101 as new data associated with the plurality of capacitors 101 is captured. Also shown is a match network 102, which may benefit from the life consumption estimation techniques disclosed herein. As shown, the life-consumed module 104 may optionally receive environmental input(s) 105, such as temperature information, to enable the life-consumed module 104 to use one or more environment input(s) 105 as factor(s) when estimating the life consumed.

As one of ordinary skill in the art will appreciate, the plurality of capacitors 101 are components of the match network 102 that play a role in achieving the functionality of the match network 102. A failure of one of the plurality of capacitors 101 may, for example, adversely affect operation of the match network 102 for its intended use.

As depicted in FIG. 1, the life-consumed module 104 may be coupled to a reliability data datastore 106 that is configured to store reliability data for one or more of the plurality of capacitors 101. The controller 103 and life-consumed module 104 depicted in FIGS. 1 and 2 are depicted as functional components and the functionality may be effectuated by components that may be distributed between the match network and components external to the match network. For example, the life-consumed module 104 and reliability data datastore 106 may reside within a housing of the match network 102 or may reside in a location that is exterior to (e.g., remote from) the match network 102. It is also contemplated that the life-consumed module 104 may reside within a housing of the match network 102 while the reliability data datastore 106 may be implemented at a location that is exterior (e.g., remote from) to the match network 102. It is also contemplated the life-consumed module 104 may be realized by components that, both, reside within the match network 102 and outside of the match network 102.

Figure 3:
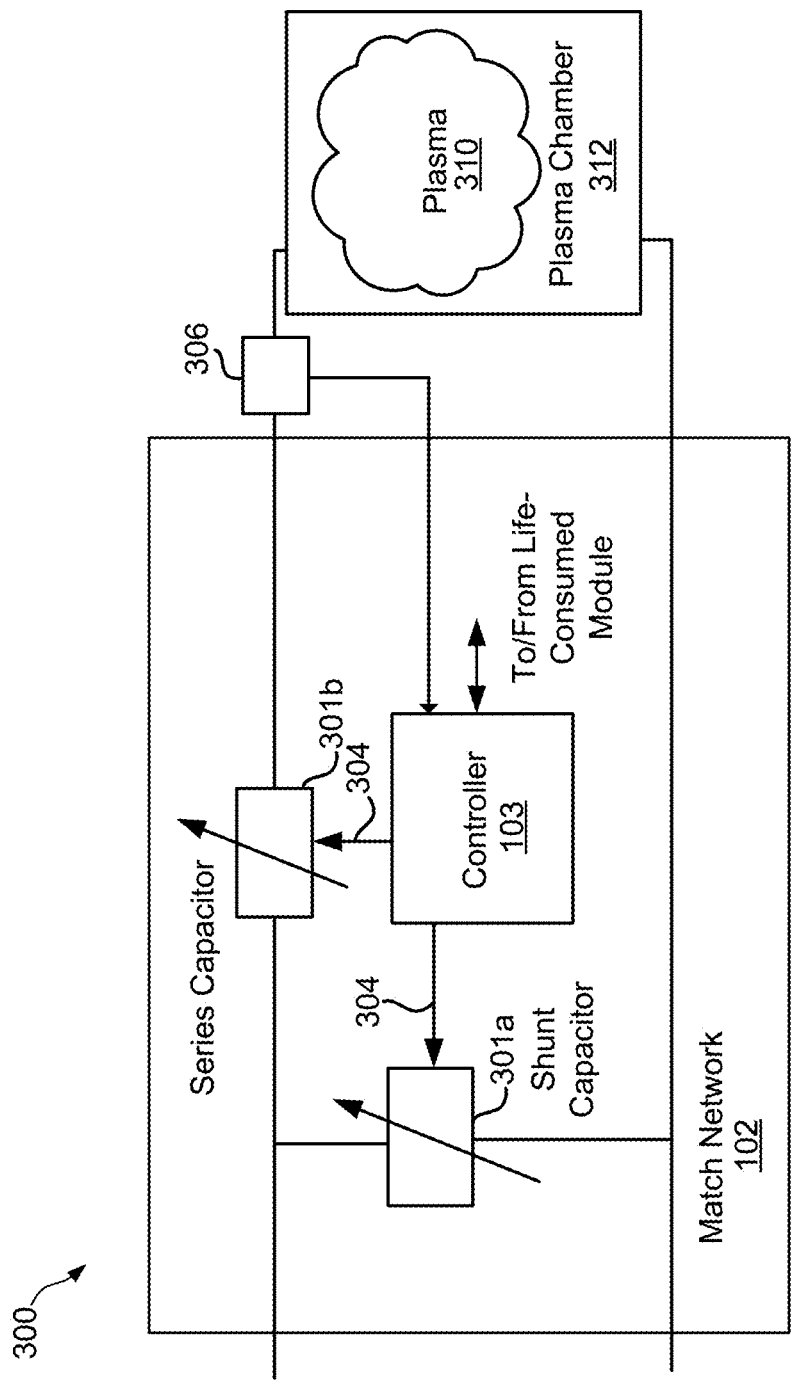
FIG. 3 is a block diagram depicting physical components of a match network that may be utilized by an embodiment of the present invention.

FIG. 3 shown is an electrical system 300 comprising the match network 102, which is shown coupled to a plasma chamber 312 that encloses a plasma 310. As those of ordinary skill will appreciate, the match network 102 may function to provide efficient transfer of power from a generator (not shown) to the plasma 310 in the plasma chamber 312 by matching the impedance of the plasma 310 to the operating impedance of the generator. The depiction of the match network 102 is a simplified representation of an example arrangement where the plurality of capacitors 101 in the match network 102 are arranged as a shunt capacitor 301a and a series capacitor 301b.

As shown, the shunt capacitor 301a is disposed across transmission lines of the match network 102 and a series capacitor 301b disposed in series along one of the transmission lines. Each of the shunt capacitor 301a and the series capacitor 301b may be coupled to the controller 103 by control lines 304 to enable the controller 103 to adjust each of the series capacitor 301b and the shunt capacitor 301a based upon a desired impedance of the match network 102.

For example, one or more sensors 306 (e.g., a directional coupler) may be coupled to an output of the match network 102, and as one of ordinary skill in the art will appreciate, the output of the one or more sensors 306 may provide an indication of reflected power to the controller 103, and the controller 103 may control the series capacitor 301b and/or the shunt capacitor 301a in order to minimize the reflected power. Each of the shunt capacitor 301a and the series capacitor 301b may be realized by variable capacitors, which may be realized by variable vacuum capacitors or a plurality of switched capacitors (that provide a selectable capacitance that can be varied). More specifically, each of the shunt capacitor 301a and the series capacitor 301b may include a variable vacuum capacitor and/or a plurality of switched capacitors.

Figure 4:
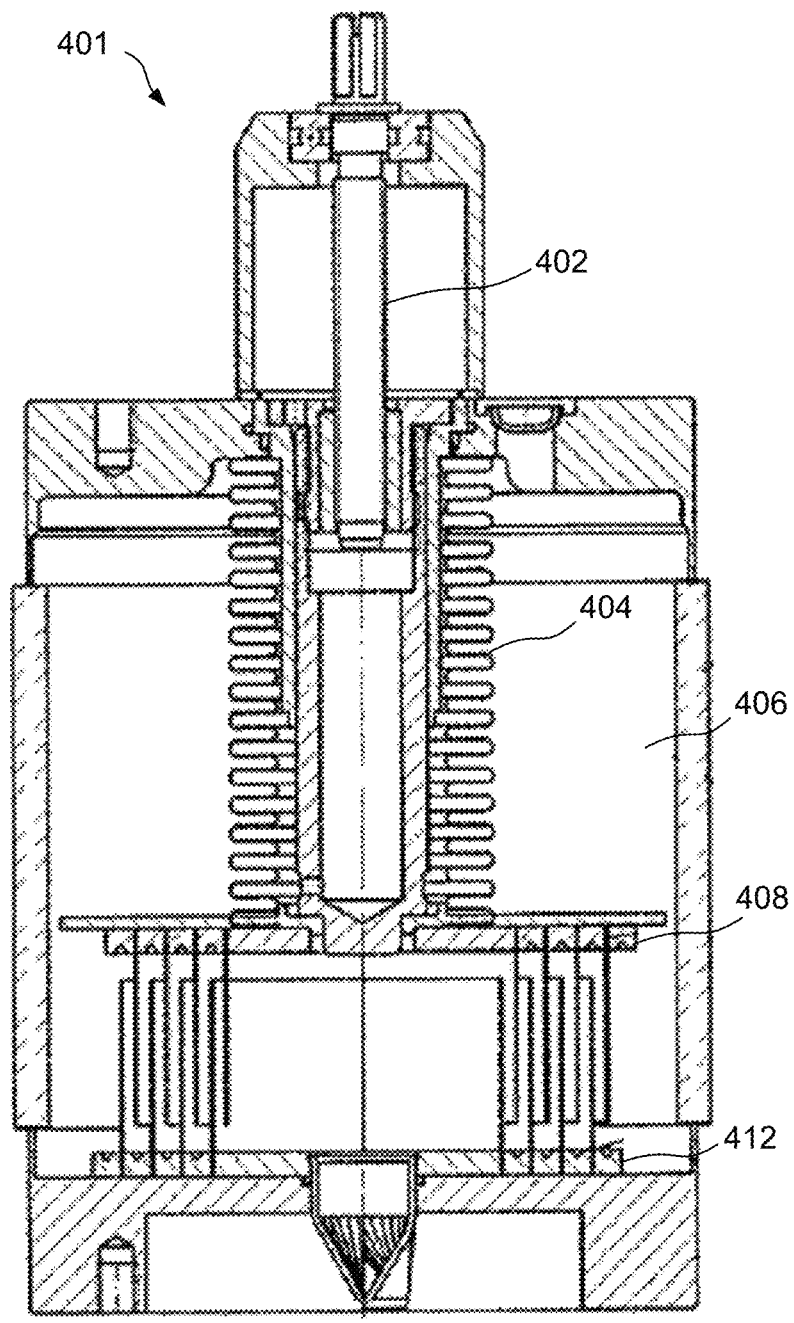
FIG. 4 is a cross-sectional view of a vacuum capacitor that may be utilized by an embodiment of the present invention.

Referring to FIG. 4, shown is an exemplary vacuum capacitor 401 comprising a first electrode 408 and a second electrode 412 separated by a vacuum dielectric 406. As shown, the vacuum capacitor also includes a screw 402 and bellows 404. The depicted vacuum capacitor is only one example of the type of vacuum capacitor that may be used in connection with the present disclosure. Those of ordinary skill in the art will appreciate that the screw 402 may be coupled (directly or indirectly) to a stepper motor (not shown), and the controller 103 may precisely control the stepper motor to move the screw 402 to adjust a capacitance of the vacuum capacitor 401.

More specifically, there is a well-defined relationship between the position of the screw 402 and the capacitance of the capacitor 401, and the controller 103 is programmed, based upon this relationship, to control the stepper motor in order to achieve a desired capacitance for the vacuum capacitor 401. As a consequence, the controller 103 is capable of providing telemetry data 120 that includes an indication of movement of the screw 402 (e.g., in terms of a number of turns the screw 402) during operation of the capacitor 401. Moreover, there is a well-defined relationship between the movement of the screw 402 and movement of the bellows 404; thus, the controller 103 may also provide telemetry data 120 indicative of the movement of the bellows 404. Alternatively, the life-consumed module 104 may calculate movement of the bellows 404 based upon the telemetry data that indicates movement of the screw 402.

Applicant has found that the screw 402 and bellows 404 are particularly prone to degrading and failing over time, and as a consequence, the screw and bellows are often a primary cause of a failure of the match network 102. For example, threads of the screw 402 are prone to wearing down over time, and the bellows are prone to cracking, which leads to a breach of the vacuum seal of the capacitor 401.

Although the design of the capacitor 401 is common, there are many other vacuum capacitor designs that may be used in connection with the systems and methodologies disclosed herein.

Figure 5:
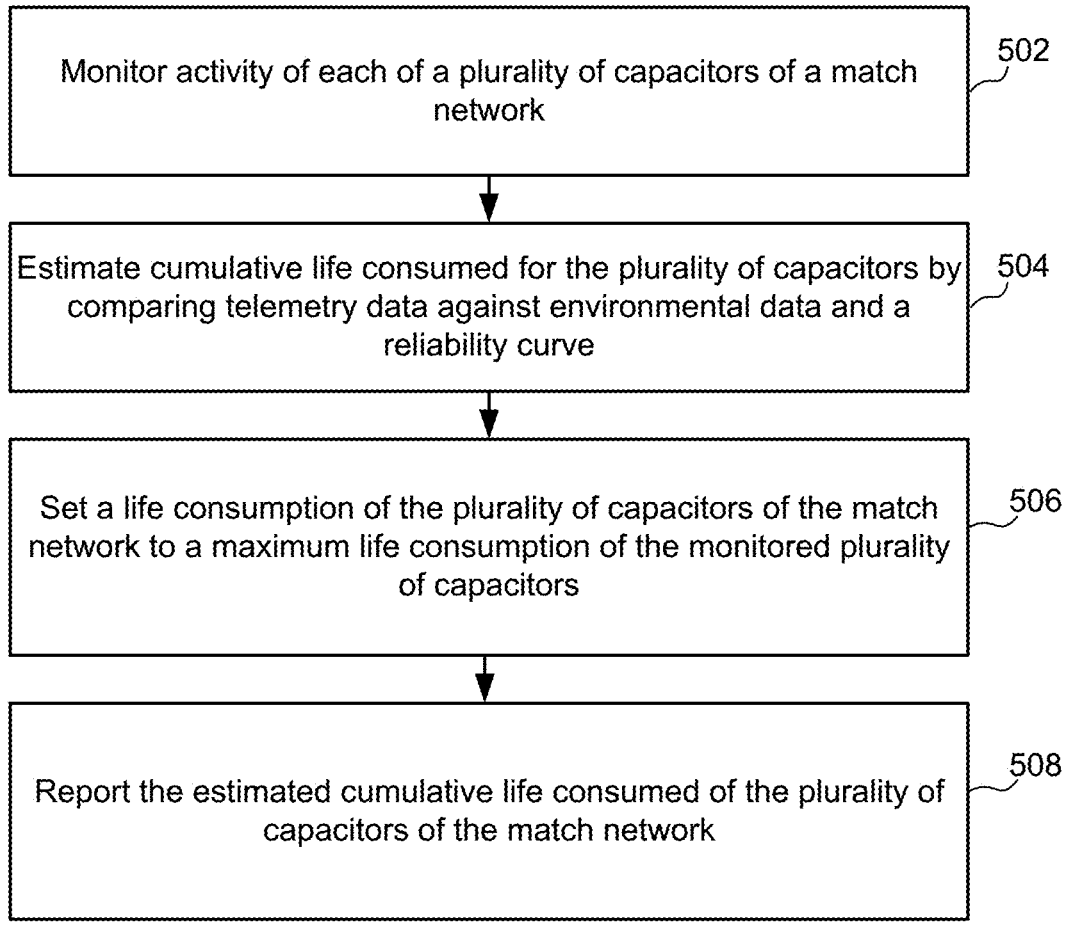
FIG. 5 is a flowchart depicting a method that may be executed by the life-consumed module in connection with the match networks and capacitors of an embodiment of the present invention.

Referring to FIG. 5, shown is a flowchart depicting a method that may be executed by the life-consumed module 104 in connection with the match network 102, 302 and plurality of capacitors 101 disclosed herein. As shown, telemetry data from the plurality of capacitors 101 of the match network 102 may be monitored (Block 502). As discussed above, the controller 103 may provide telemetry data that provides an indication of screw and bellows movement. The monitoring at Block 502 may be substantially continuous monitoring (e.g., independent of events) of the telemetry data or, as discussed with reference to FIG. 8, the monitoring may be event-based monitoring. As shown, the life-consumed module 104 may also estimate cumulative life consumed for each of the plurality of capacitors by comparing telemetry data against environmental data and a reliability curve (Block 504). The life-consumed module 104 may also set a life consumption of the plurality of capacitors of the match network to a maximum life consumption of the monitored plurality of capacitors (Block 506). The estimated cumulative life consumed of the plurality of capacitors of the match network may then be reported (Block 508).

Figure 6:
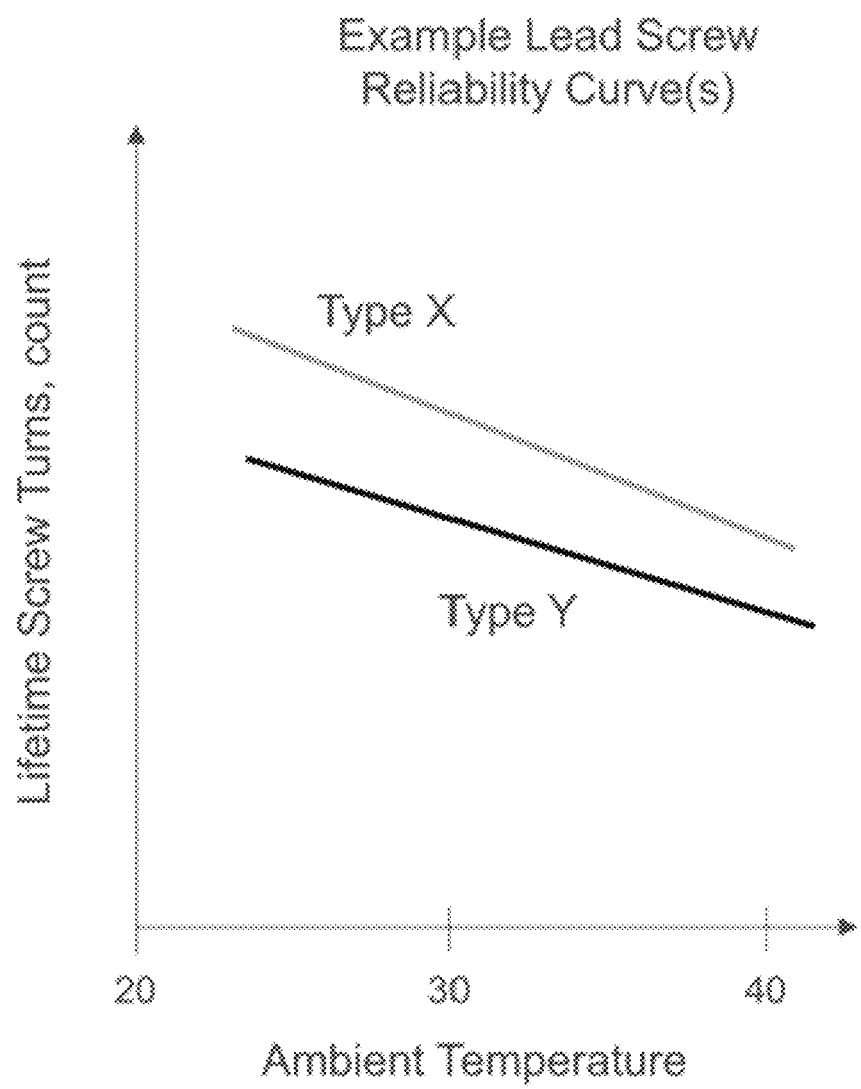
FIG. 6 is a graph depicting a reliability curve for various lead screws that may be utilized by a variable vacuum capacitor in an embodiment of the present invention.
Figure 7:
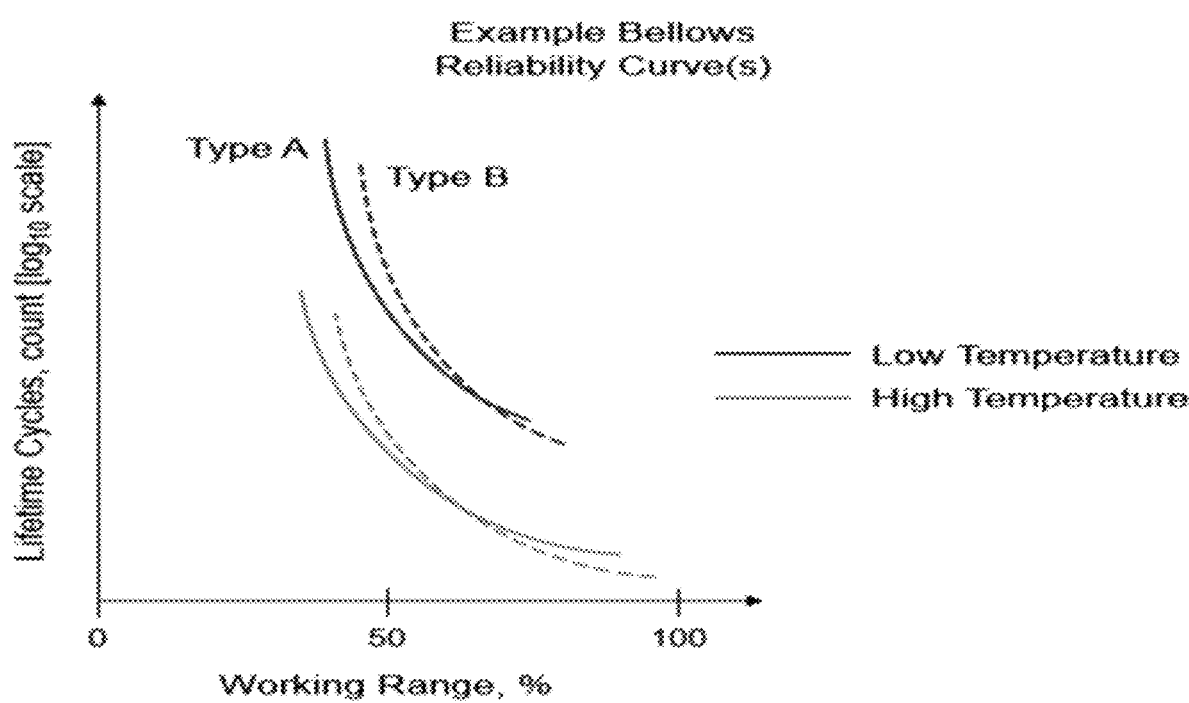
FIG. 7 is a graph depicting a reliability curve for various bellows that may be utilized by a variable vacuum capacitor in an embodiment of the present invention.

An estimate of capacitors' life consumed may be determined at Block 504 by comparing the activity of the capacitor against reliability curve(s) stored in the reliability data datastore. For example, each type of variable vacuum capacitor in the match network may have a distinct set of reliability curves. Referring to FIG. 6 for example, shown are examples of reliability curves for two types of lead screws. And in FIG. 7, shown are reliability curves for two types of bellows. As shown in FIGS. 6 and 7, the reliability curves may depend upon one or more environment conditions, such as for example, temperature. And the environmental input(s) may enable the life-consumed module to select the reliability curves (and/or modify the reliability curves) based upon the current environmental conditions. Using the telemetry data, the life-consumed module is able to translate screw movement and bellows movement into life consumed values.

For example, the telemetry data may indicate that the capacitor spends approximately 80% of its operating time at low temperature, say 25° C., and the remaining 20% at high temperature, say 40° C. Referencing FIG. 6, from which one can determine the expected number of lifetime lead screw turns for a specific temperature, one can determine the expected number of lifetime lead screw turns for a composite temperature profile by applying, for example, a weighted sum proportional to the observed values derived from the telemetry data. Similarly, the same procedure can be applied to the bellows reliability curves where the bellows movement may be characterized in terms of cycles where each cycle is movement of the bellows from a compressed position to an extended position and back to the compressed position, with the added dimension/factor of a partial cycle (also known as a working range) being utilized to determine the expected lifetime cycles. Those of ordinary skill in the art will appreciate, in view of this disclosure, that a collection of partial cycles may be converted to an equivalent number of whole cycles to enable the reliability data (that may be characterized in terms of whole cycles) to be accessed.

Figure 8:
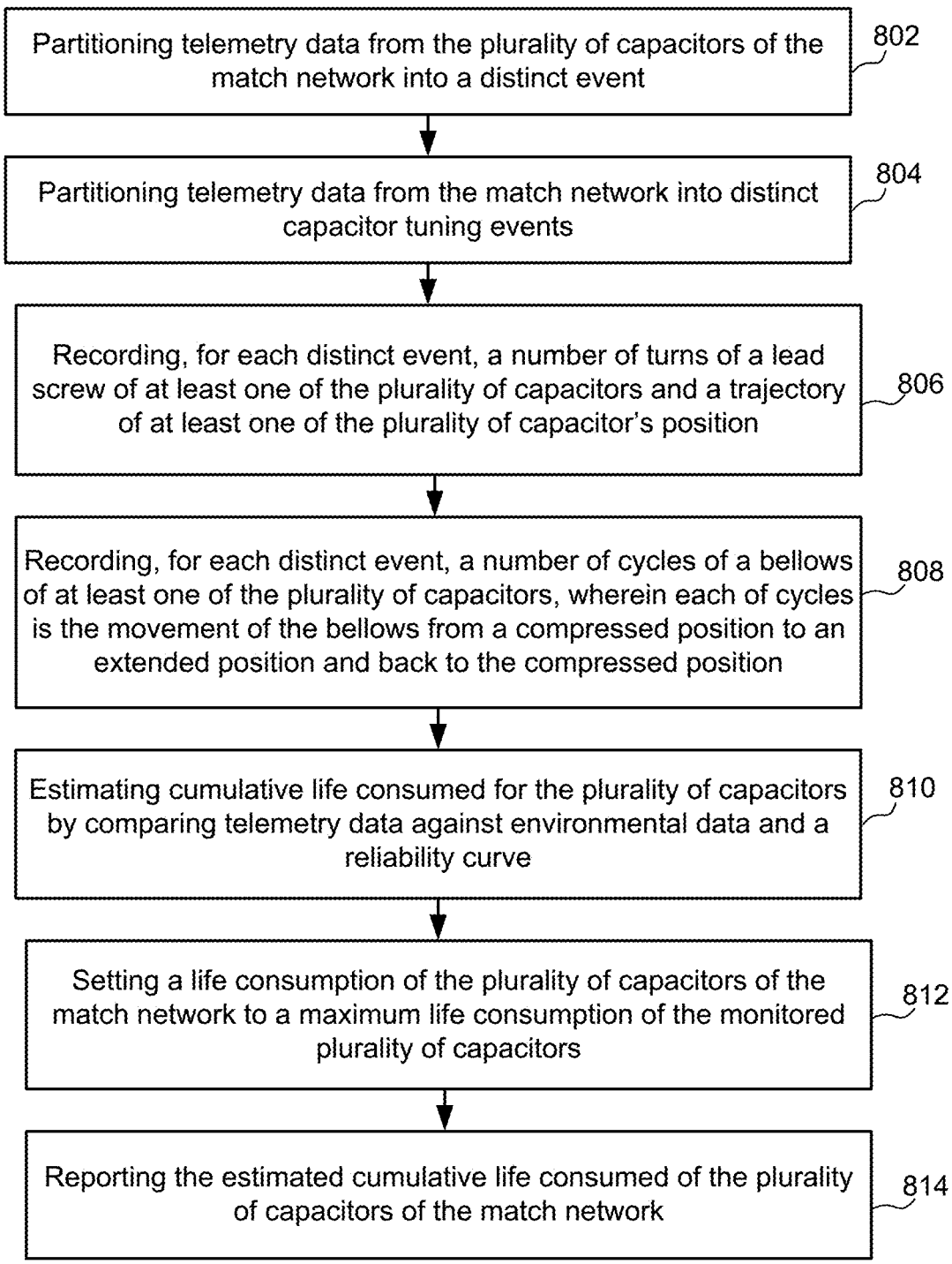
FIG. 8 is a flowchart depicting a method that may be executed by the life-consumed module in connection with the match networks and capacitors of an embodiment of the present invention.

Referring to FIG. 8, shown is a flowchart depicting a method that may be executed by the life-consumed module 104 in connection with the match network 102 and the plurality of capacitors 101 disclosed herein. As shown, telemetry data from the plurality of capacitors 101 of the match network may be partitioned into distinct events (Block 802). In the context of a variable capacitor (e.g., the vacuum capacitor 401) of the match network 102, the partitioning of the telemetry data into distinct events may comprise partitioning telemetry data from the match network 102 into distinct capacitor tuning events (Block 804). The tuning event may be, for example, an adjustment of the match network 102 in response to a mismatch between a source impedance of a generator and an impedance of a plasma load. And the recording, for each event, may comprise recording a number of turns of the lead screw 402 of the capacitor 401 and a trajectory of the capacitor position (Block 806). In the context of the bellows 404 of the capacitor 401 for example, life consumption may be estimated by determining a frequency distribution of partial cycles using a modified version of a four-point rain flow counting algorithm. As shown in Block 812, the life consumption of the match network 102 is set to the maximum life consumption of the monitored capacitors (e.g., based upon the maximum life consumption of the lead screws or maximum life consumption of the bellows of a capacitor). In this way, the capacitor with the shortest remaining life establishes the remaining life of the match network 102.

Referring back to FIG. 8, the partitioning of the telemetry data into distinct events may comprise recording a number of cycles of the bellows 404 of at least one of the plurality of capacitors 101, wherein a cycle is the movement of the bellows 404 from a compressed position to an extended position and back to the compressed position (Block 808). The estimation for cumulative life consumed for the plurality of capacitors can then be calculated by comparing telemetry data against environmental data and a reliability curve (Block 810). Then the life-consumed module can report the estimated cumulative life consumed of the plurality of capacitors of the match network (Block 814) to the user.

Figure 9:
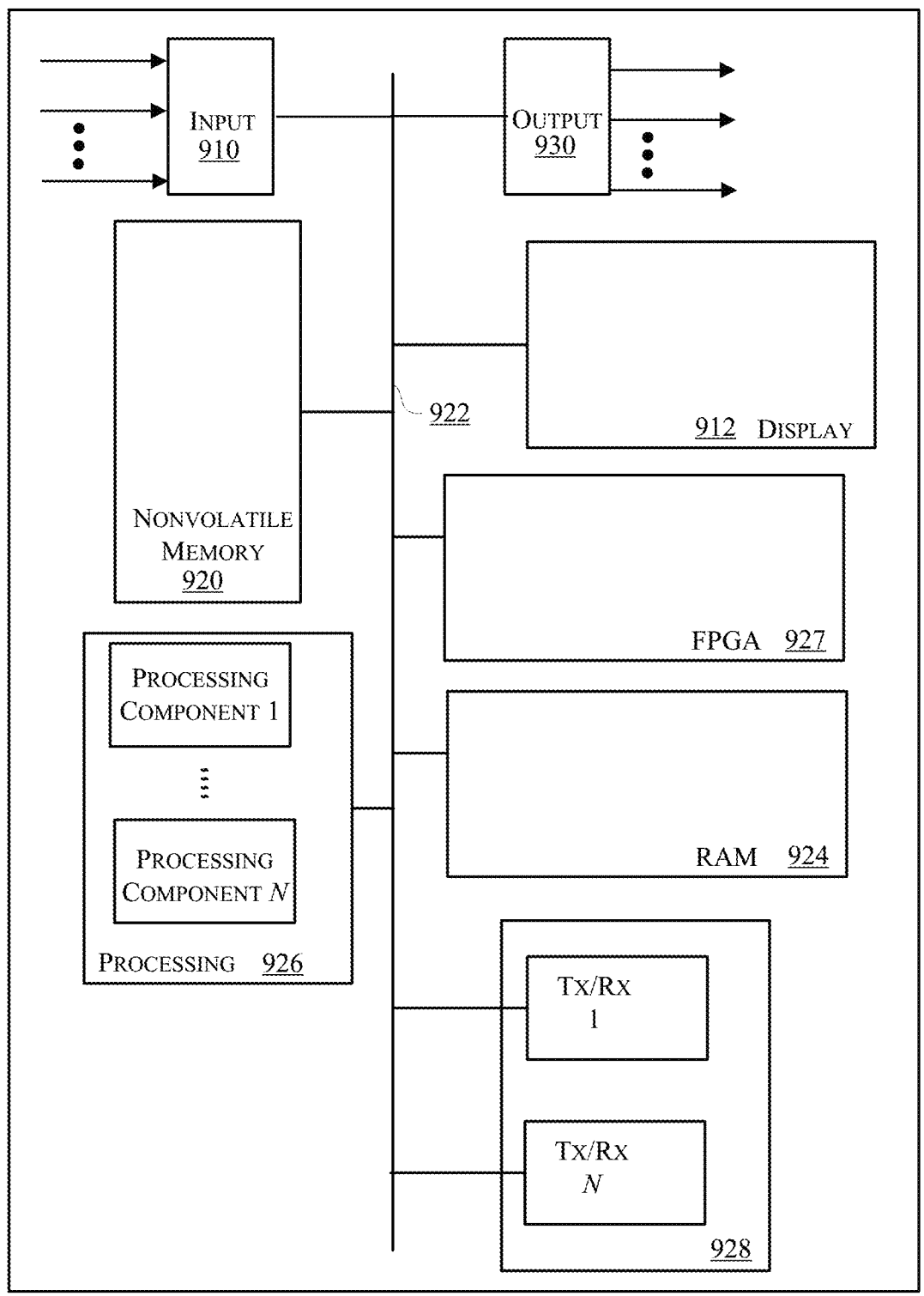
FIG. 9 is a block diagram depicting physical components that may be utilized to realize one or more aspects of the controller and life-consumed module of an embodiment of the present invention.

Referring to FIG. 9 for example, shown is a block diagram depicting physical components that may be utilized to realize one or more aspects of the controller 103 and life-consumed module 104. As shown, in this embodiment a display 912 and nonvolatile memory 920 are coupled to a bus 922 that is also coupled to random access memory ("RAM") 924, a processing portion (which includes N processing components) 926, a field programmable gate array (FPGA) 927, and a transceiver component 928 that includes N transceivers. Although the components depicted in FIG. 9 represent physical components, FIG. 9 is not intended to be a detailed hardware diagram; thus, many of the components depicted in FIG. 9 may be realized by common constructs or distributed among additional physical components. Moreover, it is contemplated that other existing and yet-to-be developed physical components and architectures may be utilized to implement the functional components described with reference to FIG. 9.

The display 912 generally operates to provide a user interface for a user, and in several implementations, the display is realized by a touchscreen display. For example, display 912 can be used to control and interact with the controller 103 and life-consumed module 104. In general, the nonvolatile memory 920 is non-transitory memory that functions to store (e.g., persistently store) data and machine readable (e.g., processor executable) code (including executable code that is associated with effectuating the methods described herein). In some embodiments, for example, the nonvolatile memory 920 includes bootloader code, operating system code, file system code, and non-transitory processor-executable code to facilitate the execution of the method described with reference to FIG. 5. The nonvolatile memory may also be used to realize the reliability data datastore and may be used to store the recorded telemetry data (e.g., tuning events such as, e.g., lead screw turns and trajectories of capacitor positions).

In many implementations, the nonvolatile memory 920 is realized by flash memory (e.g., NAND or ONENAND memory), but it is contemplated that other memory types may be utilized as well. Although it may be possible to execute the code from the nonvolatile memory 920, the executable code in the nonvolatile memory is typically loaded into RAM 924 and executed by one or more of the N processing components in the processing portion 926.

In operation, the N processing components in connection with RAM 924 may generally operate to execute the instructions stored in nonvolatile memory 920 to realize the functionality of the life-consumed module 104. For example, non-transitory processor-executable instructions to effectuate the methods described herein may be persistently stored in nonvolatile memory 920 and executed by the N processing components in connection with RAM 924. As one of ordinary skill in the art will appreciate, the processing portion 926 may include a video processor, digital signal processor (DSP), graphics processing unit (GPU), and other processing components.

In addition, or in the alternative, the field programmable gate array (FPGA) 927 may be configured to effectuate one or more aspects of the methodologies described herein (e.g., the methods described with reference to FIG. 5). For example, non-transitory FPGA-configuration-instructions may be persistently stored in nonvolatile memory 920 and accessed by the FPGA 927 (e.g., during boot up) to configure the FPGA 927 to effectuate the functions of the controller and/or life-consumed module.

The depicted transceiver component 928 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An electrical system comprising:
    a match network comprising a plurality of capacitors, the plurality of capacitors comprising at least one shunt capacitor and at least one series capacitor, the at least one shunt capacitor disposed across at least one transmission line, the at least one series capacitor disposed in series along the at least one transmission line;
    a controller coupled to the at least one shunt capacitor and the at least one series capacitor by control lines, the controller configured to:
        operate the plurality of capacitors, and
        produce telemetry data for at least one of the plurality of capacitors; and
    a life-consumed module configured to:
        receive the telemetry data from the controller, environmental data from an environmental input, and reliability data comprising a reliability curve for the at least one of the plurality of capacitors from a reliability data datastore;
        compare the telemetry data and the environmental data to the reliability curve of the at least one of the plurality of capacitors to determine a cumulative life consumed of the at least one of the plurality of capacitors; and
        report an indication of life consumed for the at least one of the plurality of capacitors.

2. The electrical system of claim 1, wherein the controller, the life-consumed module, the environmental input, and the reliability data datastore are integrated into the match network of the electrical system.

3. The electrical system of claim 1, wherein the life-consumed module, the environmental input, and the reliability data datastore are implemented at a location that is exterior to the match network of the electrical system.

4. The electrical system of claim 1, wherein the at least one of the plurality of capacitors comprises a screw and a bellows.

5. The electrical system of claim 4, wherein the life-consumed module is further configured to partition the telemetry data into distinct tuning events and record, for each distinct tuning event, an associated activity of the match network.

6. The electrical system of claim 5, wherein the associated activity of the match network comprises movement of the screw of the at least one of the plurality of capacitors.

7. The electrical system of claim 5, wherein the associated activity of the match network comprises movement of the bellows.

8. The electrical system of claim 5, wherein the associated activity of the match network comprises movement of the screw of the at least one of the plurality of capacitors, a trajectory of a position of the at least one of the plurality of capacitors, and a movement of the bellows.

9. The electrical system of claim 4, wherein the life-consumed module is further configured to:
    periodically sample and record, independent of tuning events, the telemetry data from the controller on an ongoing basis to obtain movement of the screw of the at least one of the plurality of capacitors and movement of the bellows.

10. A method for measuring life consumption of a match network comprising:
    monitoring activity of each of a plurality of capacitors of the match network, the plurality of capacitors comprising at least one shunt capacitor and at least one series capacitor, the at least one shunt capacitor disposed across at least one transmission line, the at least one series capacitor disposed in series along the at least one transmission line;
    producing telemetry data for at least one of the plurality of capacitors;
    receiving environmental data from an environmental input;
    receiving reliability data comprising a reliability curve for the at least one of the plurality of capacitors from a reliability data datastore;
    comparing the telemetry data and the environmental data to the reliability curve of the at least one of the plurality of capacitors to determine a cumulative life consumed of the at least one of the plurality of capacitors; and
    reporting an indication of life consumed for the at least one of the plurality of capacitors.

11. The method of claim 10, wherein the monitoring activity comprises partitioning the monitored activity into distinct tuning events and recording, for each distinct tuning event, an associated activity of the match network.

12. The method of claim 11, wherein the associated activity comprises movement of a screw of each of the plurality of capacitors.

13. The method of claim 11, wherein the associated activity comprises movement of a bellows of each of the plurality of capacitors.

14. The method of claim 11, wherein the associated activity comprises movement of a screw of at least one of the plurality of capacitors, a trajectory of at least one of the plurality of capacitor's position, and a movement of a bellows of at least one of the plurality of capacitors.

15. The method of claim 11, wherein the monitoring activity comprises periodical sampling of the monitored activity of each of a plurality of capacitors.

16. A non-transitory, tangible processor readable storage medium, encoded with processor readable instructions to perform a method for measuring life consumption of at least one of a plurality of capacitors of a match network, the plurality of capacitors comprising at least one shunt capacitor and at least one series capacitor, the at least one shunt capacitor disposed across at least one transmission line, the at least one series capacitor disposed in series along the at least one transmission line, the instructions comprising instructions to:
  monitor activity of at least one of the plurality of capacitors of the match network;
  producing telemetry data for at least one of the plurality of capacitors;
  receiving environmental data from an environmental input;
  receiving reliability data comprising a reliability curve for the at least one of the plurality of capacitors from a reliability data datastore;
  comparing the telemetry data and the environmental data to the reliability curve of the at least one of the plurality of capacitors to determine a cumulative life consumed of the at least one of the plurality of capacitors; and
  reporting an indication of life consumed for the at least one of the plurality of capacitors.

17. The non-transitory, tangible processor readable storage medium of claim 16 wherein the instructions further comprise partitioning the monitoring activity into distinct events and recording, for each distinct event, an associated activity of the match network, wherein the distinct events are a number of turns of a screw of at least one of the plurality of capacitors, and a trajectory of at least one of the plurality of capacitor's position, and a number of cycles of a bellows of at least one of the plurality of capacitors, wherein the number of cycles is movement of the bellows from a compressed position to an extended position and back to the compressed position.

18. The non-transitory, tangible processor readable storage medium of claim 16 wherein the instructions to estimate comprise instructions to estimate by:
  receiving the telemetry data from a controller, environmental data from an environmental input, and reliability data comprising a reliability curve for at least one of the plurality of capacitors from a reliability data datastore;
  comparing the telemetry data and the environmental data to the reliability curve of at least one of the plurality of capacitors;
  determining the cumulative life consumed of at least one of the plurality of capacitors; and
  reporting an estimate of indicative life consumed for at least one of the plurality of capacitors.

19. The non-transitory, tangible processor readable storage medium of claim 16 wherein the instructions to estimate comprise instructions to estimate by:
  monitoring activity of each of a plurality of capacitors of the match network;
  estimating cumulative life consumed for the plurality of capacitors by comparing telemetry data against environmental data and a reliability curve;
  setting a life consumption of the electrical device to a maximum life consumption of the monitored plurality of capacitors; and
  reporting the estimated cumulative life consumed of the plurality of capacitors of the match network.

20. The non-transitory, tangible processor readable storage medium of claim 16 wherein the instructions further comprise periodical sampling of the telemetry data from the controller.

* * * * *